(12) United States Patent
Spitsberg et al.

(10) Patent No.: US 6,916,561 B1
(45) Date of Patent: Jul. 12, 2005

(54) THERMAL BARRIER COATINGS WITH LOWER POROSITY FOR IMPROVED IMPACT AND EROSION RESISTANCE

(75) Inventors: Irene Spitsberg, Loveland, OH (US); Brett Allen Boutwell, Liberty Township, OH (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 10/748,518

(22) Filed: Dec. 30, 2003

(51) Int. Cl.$^7$ .......................... B32B 15/04; F03B 3/12; C23C 4/10; C23C 16/06
(52) U.S. Cl. ................ 428/701; 428/702; 428/632; 428/697; 428/699; 428/336; 428/304.4; 416/241 B; 427/453; 427/596; 427/255.31
(58) Field of Search ................ 428/632, 633, 428/304.3, 336, 697, 699, 701, 702; 416/241 B; 427/446, 453, 596, 255.31

(56) References Cited

U.S. PATENT DOCUMENTS

| | | | |
|---|---|---|---|
| 4,861,618 A | | 8/1989 | Vine et al. |
| 4,886,768 A | * | 12/1989 | Tien .................... 501/104 |
| 5,104,832 A | * | 4/1992 | Michel et al. .......... 501/103 |
| 5,350,599 A | | 9/1994 | Rigney et al. |
| 5,384,200 A | | 1/1995 | Giles et al. |
| 5,705,231 A | | 1/1998 | Nissley et al. |
| 5,942,334 A | | 8/1999 | Wortman |
| 5,981,088 A | | 11/1999 | Bruce et al. |
| 6,025,078 A | | 2/2000 | Rickerby et al. |
| 6,054,184 A | | 4/2000 | Bruce et al. |
| 6,117,560 A | | 9/2000 | Maloney |
| 6,123,997 A | | 9/2000 | Schaeffer et al. |
| 6,183,884 B1 | | 2/2001 | Rickerby |
| 6,284,323 B1 | | 9/2001 | Maloney |
| 6,319,614 B1 | | 11/2001 | Beele |
| 6,333,118 B1 | | 12/2001 | Alperine et al. |
| 6,352,788 B1 | | 3/2002 | Bruce |
| 6,387,526 B1 | | 5/2002 | Beele |
| 6,465,090 B1 | | 10/2002 | Stowell et al. |
| 2003/0044624 A1 | | 3/2003 | Spitsberg et al. |
| 2003/0224200 A1 | | 12/2003 | Bruce |

OTHER PUBLICATIONS

Hwang et al., "Grain Size Control of Tetragonal Zirconia Polycrystals Using the Space Charge Concept", J. Am. Ceram. Soc., 1990, 73(11):3269–77.

Bruce, "Development of 1232° C (2250°) Erosion and Impact Tests for Thermal Barrier Coatings", Tribology Trans., (1998), 41(4):399–410.

(Continued)

Primary Examiner—Jennifer McNeil
(74) Attorney, Agent, or Firm—Eric W. Guttag; Jagtiani + Guttag; David L. Narciso

(57) ABSTRACT

A reduced thermal conductivity thermal barrier coating having improved impact and erosion resistance for an underlying metal substrate of articles that operate at, or are exposed to, high temperatures. This coating comprises a zirconia-containing ceramic composition having a c/a ratio in the range of from about 1.0057 to about 1.0123 and stabilized in the tetragonal phase by a stabilizing amount of a stabilizing metal oxide. The coating has a fraction of porosity of from about 0.15 to about 0.25, and an impact and erosion resistance property defined by at least one of the following formulas: (a) I=exp. [5.85−(144×s)−(3.68×p)]; and/or; (b) E=[187−(261×p)−(9989×s)], wherein s=1.0117− c/a ratio; p is the fraction of porosity; I is least about 70 g/mil; and E is least about 80 g/mil. This coating can be used to provide a thermally protected article having a metal substrate and optionally a bond coat layer adjacent to and overlaying the metal substrate. The thermal barrier coating can be prepared by depositing the zirconia-containing ceramic composition on the bond coat layer, or the metal substrate in the absence of the bond coat layer.

30 Claims, 5 Drawing Sheets

OTHER PUBLICATIONS

Kim, "Effect of $Ta_2O_5$, $Nb_2O_5$, and $HfO_2$ Alloying on the Transformability of $Y_2O_3$–Stabilized Tetragonal $ZrO_2$", J. Am. Ceram. Soc., 73(1):115–120.

Vassen et al., "Zirconates as New Materials for Thermal Barrier Coatings," J. Am. Ceram. Soc., 83(8):2023–28 (2000).

U.S. Appl. No. 10/748,516, filed Dec. 30, 2003, Gorman et al.

U.S. Appl. No. 10/748,517, filed Dec. 30, 2003, Boutwell et al.

U.S. Appl. No. 10/748,519, filed Dec. 30, 2003, Darolia et al.

U.S. Appl. No. 10/748,508, filed Dec. 30, 2003, Spitsberg et al.

U.S. Appl. No. 10/748,520, filed Dec. 30, 2003, Spitsberg et al.

U.S. Appl. No. 10/748,521, filed Dec. 30, 2003, Spitsberg et al.

U.S. Appl. No. 10/748,513, filed Dec. 30, 2003, Spitsberg et al.

* cited by examiner

THERMAL BARRIER COATINGS WITH LOWER POROSITY FOR IMPROVED IMPACT AND EROSION RESISTANCE

STATEMENT REGARDING FEDERALLY SPONSORED RESEARCH

This invention was made with Government support under Contract No. N00019-96-C-0176 awarded by the JSF Program Office. The Government has certain rights to the invention.

BACKGROUND OF THE INVENTION

This invention relates to improving the impact and erosion resistance of thermal barrier coatings having reduced thermal conductivity. This invention further relates to articles having such coatings and methods for preparing such coatings for the article.

Components operating in the gas path environment of gas turbine engines are typically subjected to significant temperature extremes and degradation by oxidizing and corrosive environments. Environmental coatings and especially thermal barrier coating are an important element in current and future gas turbine engine designs, as well as other articles that are expected to operate at or be exposed to high temperatures, and thus cause the thermal barrier coating to be subjected to high surface temperatures. Examples of turbine engine parts and components for which such thermal barrier coatings are desirable include turbine blades and vanes, turbine shrouds, buckets, nozzles, combustion liners and deflectors, and the like. These thermal barrier coatings typically comprise the external portion or surface of these components are usually deposited onto a metal substrate (or more typically onto a bond coat layer on the metal substrate for better adherence) from which the part or component is formed to reduce heat flow (i.e., provide thermal insulation) and to limit (reduce) the operating temperature the underlying metal substrate of these parts and components is subjected to. This metal substrate typically comprises a metal alloy such as a nickel, cobalt, and/or iron based alloy (e.g., a high temperature superalloy).

The thermal barrier coating is usually prepared from a ceramic material, such as a chemically (metal oxide) stabilized zirconia Examples of such chemically phase-stabilized zirconias include yttria-stabilized zirconia, scandia-stabilized zirconia, calcia-stabilized zirconia, and magnesia-stabilized zirconia. The thermal barrier coating of choice is typically a yttria-stabilized zirconia ceramic coating. A representative yttria-stabilized zirconia thermal barrier coating usually comprises about 7 weight % yttria and about 93 weight % zirconia. The thickness of the thermal barrier coating depends upon the metal part or component it is deposited on, but is usually in the range of from about 3 to about 70 mils (from about 76 to about 1778 microns) thick for high temperature gas turbine engine parts.

Although significant advances have been made in improving the durability of thermal barrier coatings for turbine engine components, such coatings are still susceptible to various types of damage, including objects ingested by the engine, erosion, oxidation, and attack from environmental contaminants. In addition, in trying to achieve reduced thermal conductivity, other properties of the thermal barrier coating can be adversely impacted. For example, the composition and crystalline microstructure of a thermal barrier coating, such as those prepared from yttria-stabilized zirconia, can be modified to impart to the coating an improved reduction in thermal conductivity, especially as the coating ages over time. However, such modifications can also unintentionally interfere with desired spallation resistance, as well as resistance to particle erosion, especially at the higher temperatures that most turbine components are subjected to. As a result, the thermal barrier coating can become more susceptible to damage due to the impact of, for example, objects ingested by the engine, as well as erosion.

Accordingly, it would be desirable to be able to improve the impact and erosion resistance of thermal barrier coatings having reduced thermal conductivity. It would be further desirable to be able to modify the chemical composition of yttria-stabilized zirconia-based thermal barrier coating systems to provide such reduced thermal conductivity, yet still retain at least acceptable impact and erosion resistance in such coatings.

BRIEF DESCRIPTION OF THE INVENTION

An embodiment of this invention relates to improving the impact and erosion resistance of a thermal barrier coating having reduced thermal conductivity that is used with an underlying metal substrate of articles that operate at, or are exposed, to high temperatures. This thermal barrier coating comprises a zirconia-containing ceramic composition having a c/a ratio of the zirconia lattice in the range of from about 1.0057 to about 1.0110 and stabilized in the tetragonal phase by a stabilizing amount of a stabilizing metal oxide, the thermal barrier coating having:

1. a fraction of porosity of from about 0.15 to about 0.25; and
2. an impact and erosion resistance property defined by at least one of the following formulas:

$$I = \exp.[5.85 - (144 \times s) - (3.68 \times p)]; \qquad (a)$$

$$E = [187 - (261 \times p) - (9989 \times s)]; \qquad (b)$$

wherein $s = 1.0117 - c/a$ ratio; p is the fraction of porosity; I is at least about 70 g/mil; and E is at least about 80 g/mil.

Another embodiment of this invention relates to a thermally protected article. This protected article comprises:

A. a metal substrate;

B. optionally a bond coat layer adjacent to and overlaying the metal substrate; and C. a thermal barrier coating (as previously described) adjacent to and overlaying the bond coat layer (or overlaying the metal substrate if the bond coat layer is absent).

Another embodiment of this invention relates to a method for preparing the thermal barrier coating on a metal substrate to provide a thermally protected article. This method comprises the steps of:

A. optionally forming a bond coat layer on the metal substrate;

B. depositing on the bond coat layer (or on the metal substrate in the absence of the bond coat layer) the zirconia-containing ceramic composition previously described to form the thermal barrier coating having the previously described porosity and impact/erosion resistance properties.

The thermal barrier coatings of this invention provide several significant benefits when used with metal substrates of articles exposed to high temperatures, such as turbine components. The thermal barrier coatings of this invention provide a desirable balance of reduced thermal conductivity for the thermally protected article with improved impact and erosion resistance. This improvement in impact and erosion resistance for the thermal barrier coating can be achieved while allowing flexibility in using a variety of zirconia-containing ceramic compositions that can impart to the thermal barrier coating desirable reduced thermal conductivity properties.

DETAILED DESCRIPTION OF THE INVENTION

Figure 1:
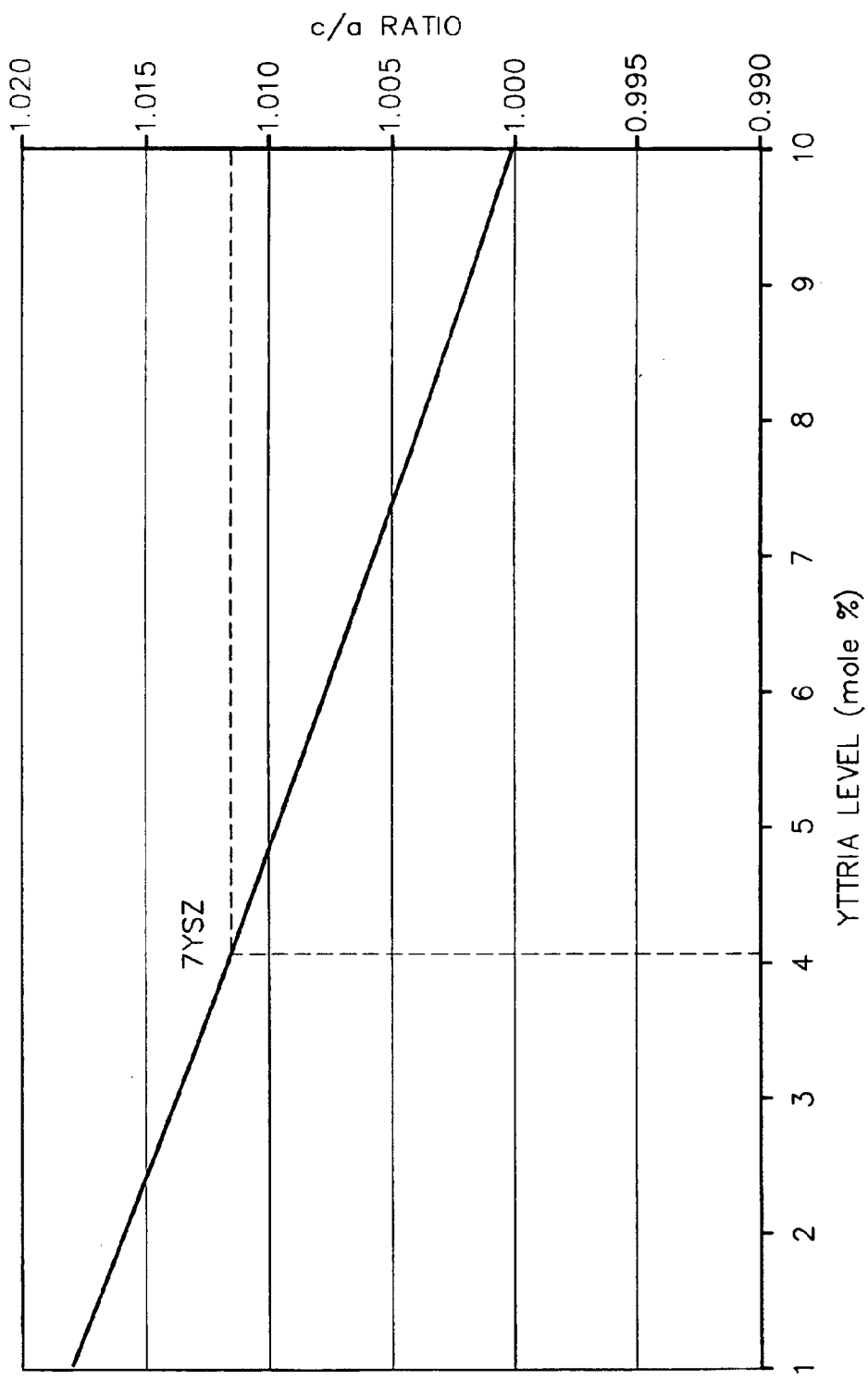
FIG. 1 represents a graphical plot of the calculated c/a ratios of the zirconia lattice as a function of yttria content.

As used herein, the term "zirconia-containing ceramic compositions" refers to ceramic compositions where zirconia is the primary component that are useful as thermal barrier coatings that are capable of reducing heat flow to the underlying metal substrate of the article, i.e., forming a thermal barrier, and which have a melting point that is typically at least about 2600° F. (1426° C.), and more typically in the range of from about from about 3450° to about 4980° F. (from about 1900° to about 2750° C.).

As used herein, the term "fraction of porosity" refers to the volume fraction of porosity defined by unity (i.e., 1), minus the ratio of the actual density of the thermal barrier coating to its theoretical density.

As used herein, the term "comprising" means various compositions, compounds, components, layers, steps and the like can be conjointly employed in the present invention. Accordingly, the term "comprising" encompasses the more restrictive terms "consisting essentially of" and "consisting of."

All amounts, parts, ratios and percentages used herein are by mole unless otherwise specified.

Zirconia-containing ceramic compositions useful in this invention impart improved thermal conductivity properties to the resulting thermal barrier coatings, and in particular lower thermal conductivity. Thermal conductivity K is defined by the following equation (1):

$$K = \alpha \times (1-p) \times C_p \times D_t \qquad (1)$$

where $\alpha$ is the thermal diffusivity, p is the fraction of porosity, $C_p$ is the specific heat (in J*K/g), and $D_t$ is the theoretical density. As be seen from equation (1) above, the thermal conductivity depends on thermal diffusivity and porosity.

Suitable zirconia-containing compositions useful herein include those which comprise at least about 91 mole % zirconia, and typically from about 91 to about 97 mole % zirconia, more typically from about 93.5 to about 95 mole % zirconia. These zirconia-containing compositions further comprise a stabilizing amount of stabilizing metal oxide. This stabilizing metal oxide can be selected from the group consisting of yttria, calcia, ceria, scandia, magnesia, india, lanthana, gadolinia, neodymia, samaria, dysprosia, erbia, ytterbia, europia, praseodymia, and mixtures thereof. The particular amount of this metal oxide that is "stabilizing" will depend on a variety of factors, including the metal oxide used and the erosion and impact resistance. Typically, the stabilizing metal oxide comprises from about 3 about 9 mole %, more typically from about 5 to about 6.5 mole %, of the composition. The zirconia-containing ceramic compositions used herein typically comprise yttria, lanthana, or mixtures thereof as the stabilizing metal oxide, and more typically yttria. The zirconia-containing ceramic compositions used herein can also optionally comprise small amounts of hafnia, titania, tantala, niobia and mixtures thereof.

Particularly suitable zirconia-containing ceramic compositions for use herein are disclosed in copending U.S. nonprovisional applications entitled "CERAMIC COMPOSITIONS USEFUL FOR THERMAL BARRIER COATINGS HAVING REDUCED THERMAL CONDUCTIVITY" (Spitsberg et al), Ser. No. 10/748,508, filed Dec. 30, 2003, "CERAMIC COMPOSITIONS USEFUL IN THERMAL BARRIER COATINGS HAVING REDUCED THERMAL CONDUCTIVITY" (Spitsberg et al), Ser. No. 10/748,520, filed Dec. 30, 2003, which are incorporated by reference. The zirconia-containing ceramic compositions disclosed in the first of these copending applications comprise at least about 91 mole % zirconia and up to about 9 mole % of a stabilizer component comprising a first metal oxide selected from the group consisting of yttria, calcia, ceria, scandia, magnesia, india and mixtures thereof; a second metal oxide of a trivalent metal atom selected from the group consisting of lanthana, gadolinia, neodymia, samaria, dysprosia, and mixtures thereof, and a third metal oxide of a trivalent metal atom selected from the group consisting of erbia, ytterbia and mixtures thereof. Typically, these ceramic compositions comprise from about 91 to about 97 mole % zirconia, more typically from about 92 to about 95 mole % zirconia and from about 3 to about 9 mole %, more typically from about from about 5 to about 8 mole %, of the composition of the stabilizing component; the first metal oxide (typically yttria) can comprise from about 3 to about 6 mole %, more typically from about 3 to about 5 mole %, of the ceramic composition; the second metal oxide (typically lanthana or gadolinia) can comprise from about 0.25 to about 2 mole %, more typically from about 0.5 to about 1.5 mole %, of the ceramic composition; and the third metal oxide (typically ytterbia) can comprise from about 0.5 to about 2 mole %, more typically from about 0.5 to about 1.5 mole %, of the ceramic composition, with the ratio of the second metal oxide to the third metal oxide typically being in the range of from about 0.5 to about 2, more typically from about 0.75 to about 1.33.

The zirconia-containing ceramic compositions disclosed in the second of these copending applications comprise at least about 91 mole % zirconia and a stabilizing amount up to about 9 mole % of a stabilizer component comprising a first metal oxide having selected from the group consisting of yttria, calcia, ceria, scandia, magnesia, india and mixtures thereof and a second metal oxide of a trivalent metal atom selected from the group consisting of lanthana, gadolinia, neodymia, samaria, dysprosia, erbia, ytterbia, and mixtures thereof. Typically, these ceramic compositions comprise from about 91 to about 97 mole % zirconia, more typically from about 92 to about 95 mole % zirconia and from about 3 to about 9 mole %, more typically from about 5 to about 8 mole %, of the composition of the stabilizing component; the first metal oxide (typically yttria) can comprise from about 3 to about 6 mole %, more typically from about 4 to about 5 mole %, of the ceramic composition; the second metal oxide (typically lanthana, gadolinia or ytterbia, and more typically lanthana) can comprise from about 0.5 to about 4 mole %, more typically from about 0.8 to about 2 mole %, of the ceramic composition, and wherein the mole % ratio of second metal oxide (e.g., lanthana/gadolinia/ytterbia) to first metal oxide (e.g., yttria) is in the range of from about 0.1 to about 0.5, typically from about 0.15 to about 0.35, more typically from about 0.2 to about 0.3.

Thermal barrier coatings of this invention comprise a zirconia-containing ceramic composition that is stabilized in a certain region of the tetragonal phase. The impact and erosion resistance properties of these thermal barrier coatings can be predicted on the basis of the effect of the zirconia lattice stability equivalent of the respective zirconia-containing ceramic compositions. Impact and erosion resistance performance have been found to be related to the zirconia lattice stability equivalent. This stability equivalent can be calculated based on the ratio of the zirconia lattice parameters c and a using equation (2) below:

$$\frac{c}{a} = k_1 \sum_i (r_i - r_{Zr}) \times m_i + k_2 \sum_i (V_i - V_{Zr}) \times m_i \quad (2)$$

wherein c,a are the zirconia tetragonal lattice parameters, $r_i$ is the ionic radius of the first metal oxide, $V_i$ is the valence of the metal ion of the metal oxide added, $m_i$ is the mole fraction of the metal oxide added and $k_1$ and $k_2$ are constants. See Kim, "Effect of $Ta_2O_5$, $Nb_2O_5$, and $HfO_2$ Alloying on the Transformability of $Y_2O_3$-Stabilized Tetragonal $ZrO_2$," J. Arm. Ceram. Soc., (1990) 73 (1) pp. 115–120.

Figure 2:
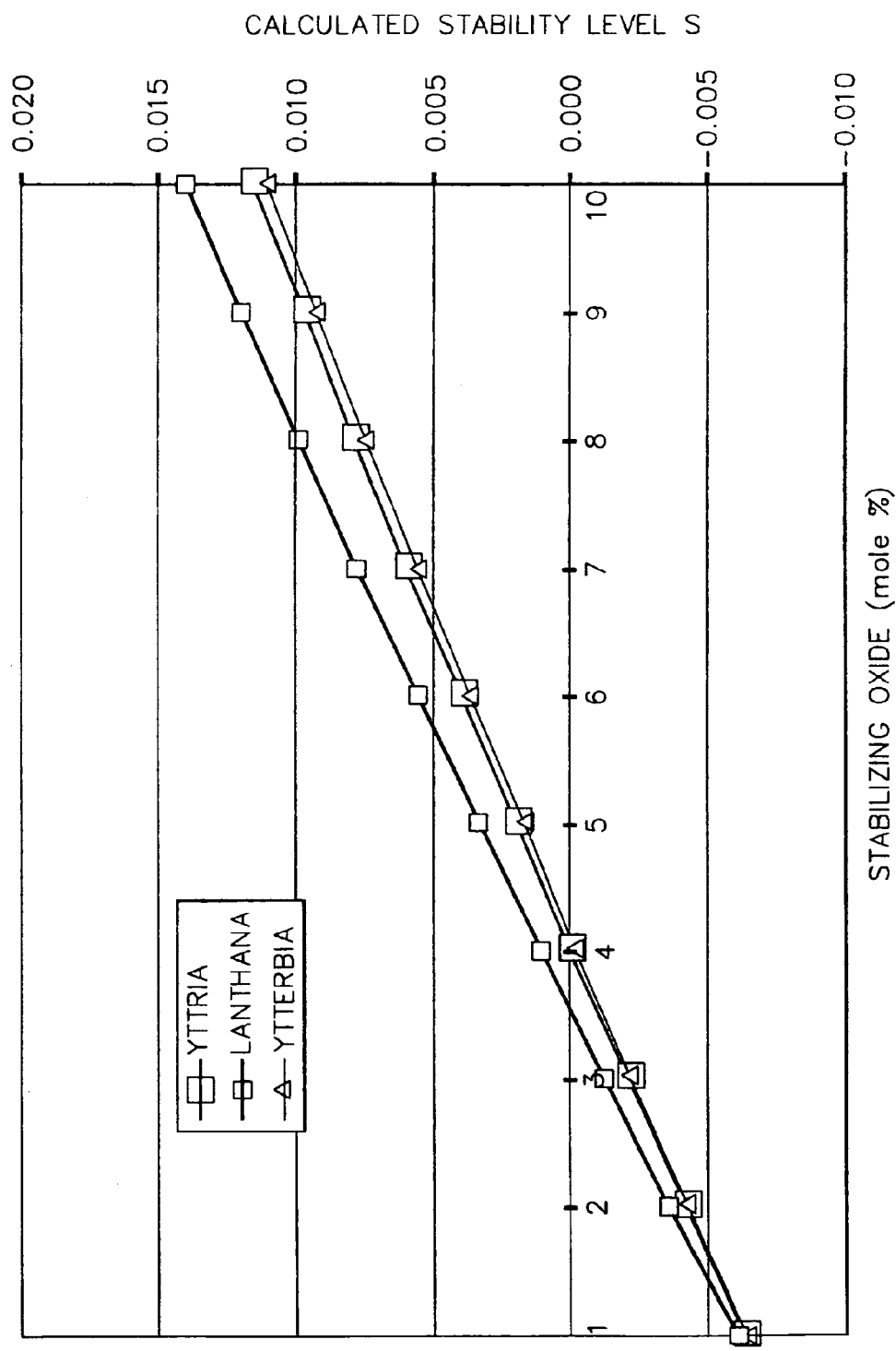
FIG. 2 represents graphical plots of the calculated stability level s of the zirconia lattice as a function of yttria, lanthana or ytterbia content.

Using equation (2) above, the lattice stability of these zirconia-containing ceramic compositions in the tetragonal phase can be calculated, including the effect of incremental additions of the stabilizing metal oxide, such as yttria. This is illustrated by FIG. 1 which represents a graphical plot of calculated c/a ratios for the zirconia lattice as a function of yttria content. The dotted line (base line) in FIG. 1 represents a zirconia-containing-ceramic composition stabilized with the equivalent of about 4 mole % (7YSZ) that has a c/a ratio of about 1.0117. Similar lattice stability values can also be calculated for the incremental addition of other stabilizing metal oxides such as lanthana and ytterbia. This is illustrated by FIG. 2 which represents graphical plots of the calculated stability level s (s=1.00117−c/a ratio) of the zirconia lattice as a function of yttria (base line), lanthana or ytterbia content. As can be seen in FIG. 2, lanthana addition has the greatest effect on lattice stability.

Referring again to FIG. 1, as the level of yttria decreases in the zirconia-containing ceramic composition, the c/a ratio conversely increases. It has been further found that, as the c/a ratio increases, impact and erosion resistance improves, i.e., lowering the yttria level improves the impact and erosion resistance performance of the zirconia-containing ceramic composition.

While increasing the c/a ratio of the zirconia-containing-ceramic composition generally improves the impact and erosion resistance performance of the resulting thermal barrier coating, these higher c/a ratios also have a significant and undesirable effect in increasing thermal conductivity (i.e., the K value is higher) of such coatings. Indeed, the zirconia-containing ceramic compositions of this invention that provide thermal barrier coatings with reduced thermal conductivity have lower c/a ratios of about 1.0110 or less, and typically in the range of from about 1.0057 to about 1.0110, more typically in the range of from about 1.0069 to about 1.0096. Because the zirconia-containing ceramic compositions of this invention have lower c/a ratios, the thermal barrier coatings resulting from these compositions will also tend to have poorer impact and erosion resistance performance, especially relative to coatings prepared from 7YSZ compositions. Accordingly, another mechanism is needed in order to achieve satisfactory erosion and impact resistance performance for thermal barrier coatings prepared from these zirconia-containing ceramic compositions having lower c/a ratios.

While the c/a ratio of the zirconia-containing composition has a very strong, exponential effect on impact resistance performance, and a less strong, linear impact on erosion resistance performance, it has been found that the porosity level of the resultant thermal barrier coating also has a very significant effect on impact and erosion resistance performance. Moreover, while decreasing porosity has an exponential effect in improving impact performance, it has been further found to have only a more limited, linear effect in increasing thermal conductivity (i.e., increasing the K value) of thermal barrier coating. Accordingly, by controlling the porosity level of the thermal barrier coating formed from a zirconia-containing ceramic composition having lower c/a ratios within the range providing desired reduced thermal conductivity, an appropriate balance of reduced thermal conductivity and satisfactory erosion and impact resistance performance can be obtained. The porosity level of the thermal barrier coatings of this invention is defined herein by the fraction of porosity of the coating. The thermal barrier coatings useful in this invention that provide an appropriate balance of reduced thermal conductivity with satisfactory impact and erosion resistance have a fraction of porosity of from about 0.15 to about 0.25, more typically from about 0.18 to about 0.20.

In order to be able to select zirconia-containing ceramic compositions having a balance of satisfactory impact and erosion resistance performance by controlling the porosity within the c/a ratio range having reduced thermal conductivity, experimental data is obtained on thermal conductivity, impact resistance and erosion resistance properties of a variety coatings and compositions. Thermal conductivity data is obtained by the laser flash method. See ASTM standard E1461-01. Impact and erosion resistance data (in g/mil) is obtained by testing thermal barrier coatings by the method described in Bruce, "Development of 1232C (2250 F) Erosion and Impact Tests for Thermal Barrier Coatings," Tribology Trans., (1998), 41(4); 399–410, which is incorporated by reference. This data obtained by the Bruce method is then normalized by coating thickness to provide an impact and erosion index that represents the impact and erosion resistance of the coating at a thickness of 1 mil. Generally, the higher the index is, the better will be the impact and erosion resistance of the coating.

The (normalized) data obtained for thermal conductivity, impact resistance, and erosion resistance are used to develop appropriate transfer functions. These transfer functions are represented as follows:

$$K = f(c/a, p) \quad (3)$$

$$I = f(c/a, p) \quad (4)$$

$$E = f(c/a, p) \quad (5)$$

wherein K is thermal conductivity, I is the normalized impact resistance (i.e., impact index), E is the normalized erosion resistance (i.e., erosion index), c/a is defined as before, and p is the fraction of porosity. Using a standard Excel "solver" procedure, equations (3), (4) and (5) can be solved simultaneously to optimize zirconia-containing ceramic compositions that can be processed into thermal barrier coatings that have the desired balance of reduced thermal conductivity with satisfactory impact and erosion resistance performance. From statistical analysis of a large population of experimental data (about 50 data points), the transfer function (4) for impact resistance (I) and the transfer function (5) for erosion resistance (E) were found to be represented by formulas (a) and (b) below:

$$I = \exp.[5.85 - (144 \times s) - (3.68 \times p)] \quad (a)$$

$$E = [187 - (261 \times p) - (9989 \times s)] \quad (b)$$

wherein $s = 1.0117 - c/a$ ratio; and p is the fraction of porosity. The regression fit is about 85% for formulas (a) and (b) above.

Figure 3:
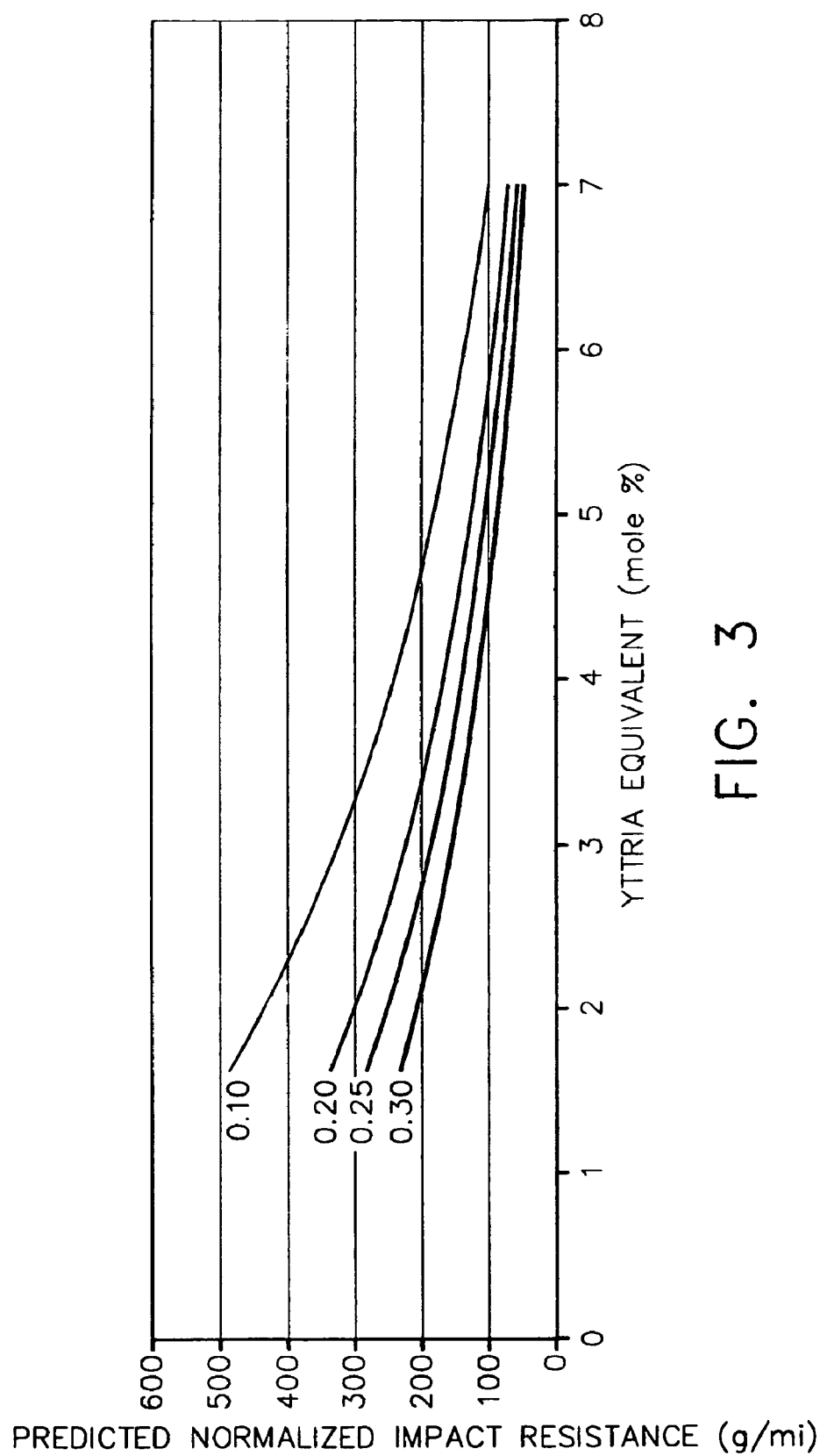
FIG. 3 represents graphical plots of the predicted normalized impact resistance values of thermal barrier coatings at various porosities as a function of yttria equivalent.
Figure 4:
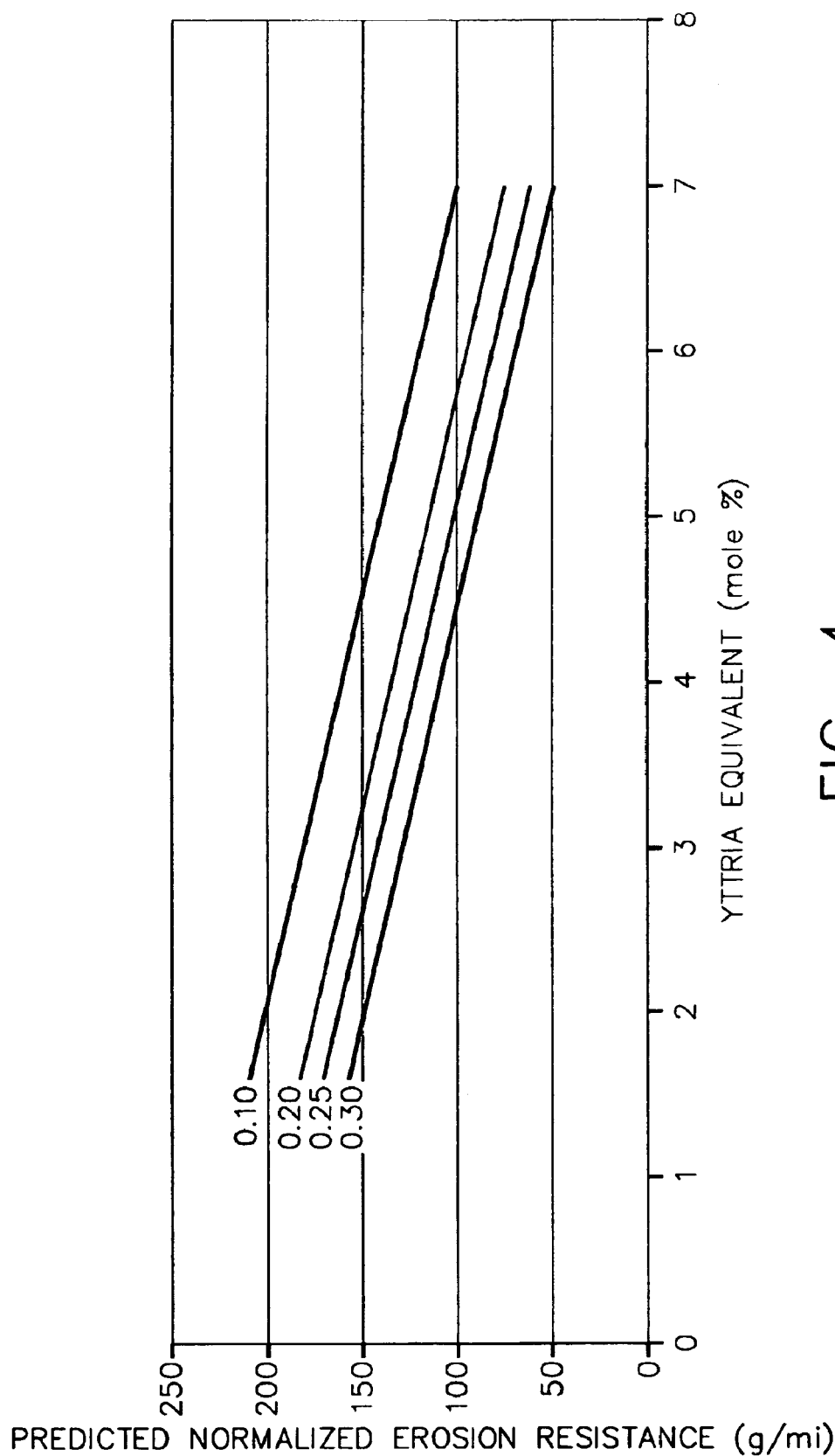
FIG. 4 represents graphical plots of predicted normalized erosion resistance values of thermal barrier coatings at various porosities as a function of yttria equivalent.

Using formulas (a) and (b) above, FIGS. 3 and 4 graphically represent plots of predicted normalized impact and erosion resistance values (in g/mil), respectively, of thermal barrier coatings at various porosities (i.e., defined by the fraction of porosity) as a function of yttria equivalent (in mole %), the yttria equivalent also corresponding to particular c/a ratios. FIG. 3 shows impact resistance to be an exponential function of c/a ratio and porosity, while FIG. 4 shows erosion resistance to be a linear function of c/a ratio and porosity. These normalized impact and erosion resistance values are also presented in the following Tables 1 and 2:

above formulas (a) or (b), and more typically defined by both of formulas (a) and (b). For thermal barrier coatings of this invention having the previously specified c/a ratios (for the zirconia-containing ceramic composition) and fraction of porosity, I is typically at least about 70 g/mil, more typically at least about 90 g/mil, while E is typically at least about 80 g/mil, more typically at least about 100 g/mil. Some illustrative zirconia-containing compositions having the previously specified c/a ratios that can be formulated into thermal barrier coatings having the previously specified fraction of porosity, to satisfy the indicated impact and erosion resistance properties I and E are as follow:

TABLE 3

| Metal Oxide (Mole %) | Composition 1 | Composition 2 |
| --- | --- | --- |
| Zirconia | 94.0 | 95.0 |
| Total Stabilizer | 6.0 | 5.0 |
| Yttria | 4.8 | 3.6 |
| Lanthana | 1.2 | 1.4 |
| Porosity | 0.18–0.20 | 0.23–0.25 |

Thermal barrier coatings of this invention are useful with a wide variety of turbine engine (e.g., gas turbine engine) parts and components that are formed from metal substrates comprising a variety of metals and metal alloys, including superalloys, and are operated at, or exposed to, high temperatures, especially higher temperatures that occur during normal engine operation. These turbine engine parts and

TABLE 1

Predicted Normalized Impact Resistance (g/mil)

| c/a Ratio | Yttria Equivalent (Mole %) | Porosity | | | | | | | |
| --- | --- | --- | --- | --- | --- | --- | --- | --- | --- |
| | | 0.1 | 0.15 | 0.18 | 0.2 | 0.25 | 0.27 | 0.3 | 0.33 |
| 1.0167 | 1.6 | 494 | 411 | 368 | 342 | 284 | 264 | 237 | 212 |
| 1.0148 | 2.5 | 370 | 308 | 276 | 256 | 213 | 198 | 177 | 159 |
| 1.0138 | 3 | 321 | 267 | 239 | 222 | 185 | 171 | 154 | 137 |
| 1.0117 | 4 | 240 | 200 | 179 | 166 | 138 | 129 | 115 | 103 |
| 1.0110 | 4.1 | 218 | 182 | 163 | 151 | 126 | 117 | 105 | 94 |
| 1.0096 | 5 | 180 | 150 | 134 | 125 | 104 | 96 | 86 | 77 |
| 1.0077 | 6 | 135 | 112 | 101 | 94 | 78 | 72 | 65 | 58 |
| 1.0069 | 6.4 | 122 | 102 | 91 | 85 | 70 | 65 | 59 | 52 |
| 1.0057 | 7 | 101 | 84 | 75 | 70 | 58 | 54 | 49 | 43 |

TABLE 2

Predicted Normalized Erosion Resistance (g/mil)

| c/a Ratio | Yttria Equivalent (Mole %) | Porosity | | | | | | | |
| --- | --- | --- | --- | --- | --- | --- | --- | --- | --- |
| | | 0.1 | 0.15 | 0.18 | 0.2 | 0.25 | 0.27 | 0.3 | 0.33 |
| 1.0167 | 1.6 | 211 | 198 | 190 | 185 | 172 | 166 | 159 | 151 |
| 1.0148 | 2.5 | 191 | 178 | 170 | 165 | 152 | 146 | 139 | 131 |
| 1.0138 | 3 | 181 | 168 | 160 | 155 | 142 | 137 | 129 | 121 |
| 1.0117 | 4 | 161 | 148 | 140 | 135 | 122 | 117 | 109 | 101 |
| 1.0110 | 4.1 | 154 | 141 | 133 | 128 | 115 | 110 | 102 | 94 |
| 1.0096 | 5 | 141 | 128 | 120 | 115 | 102 | 97 | 89 | 81 |
| 1.0077 | 6 | 121 | 108 | 100 | 95 | 82 | 77 | 69 | 61 |
| 1.0069 | 6.4 | 114 | 101 | 93 | 88 | 75 | 70 | 62 | 54 |
| 1.0057 | 7 | 101 | 88 | 80 | 75 | 62 | 57 | 49 | 41 |

The thermal barrier coatings of this invention are defined in terms of the c/a ratio of the zirconia-containing ceramic composition, the fraction of porosity p, and an impact and erosion resistance property defined by at least one of the components can include turbine airfoils such as blades and vanes, turbine shrouds, turbine nozzles, combustor components such as liners and deflectors, augmentor hardware of gas turbine engines and the like. The thermal barrier coatings of this invention can also cover a portion or all of the metal substrate. For example, with regard to airfoils such as blades, the thermal barrier coatings of this invention are typically used to protect, cover or overlay portions of the metal substrate of the airfoil rather than the entire component, e.g., the thermal barrier coatings could cover the leading edge, possibly part of the trailing edge, but not the attachment area While the following discussion of the thermal barrier coatings of this invention will be with reference to metal substrates of turbine engine parts and components, it should also be understood that the thermal barrier coatings of this invention are useful with metal substrates of other articles that operate at, or are exposed to, high temperatures.

Figure 5:
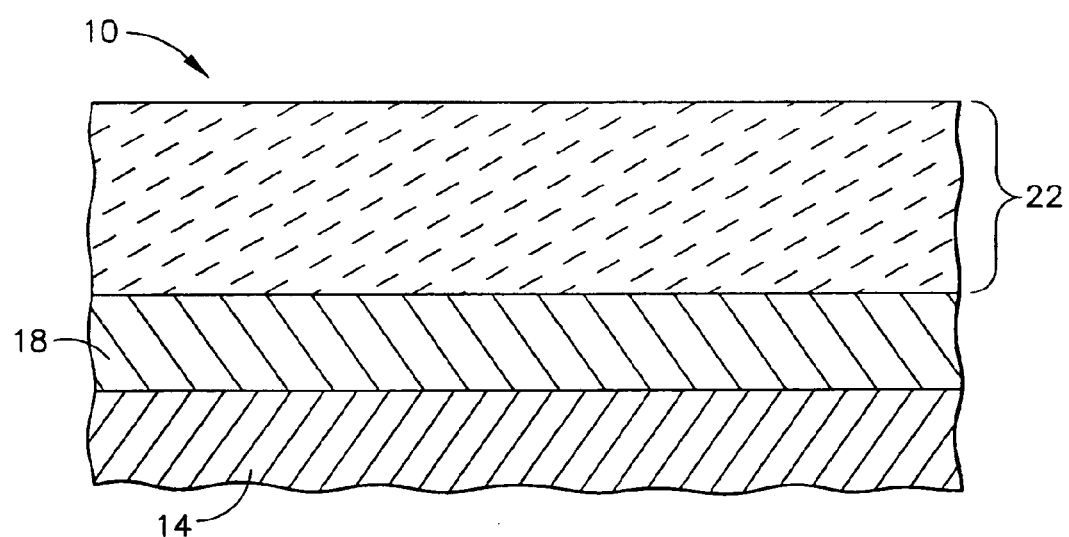
FIG. 5 is a side sectional view of an embodiment of the thermal barrier coating and coated article of this invention.

The various embodiments of the thermal barrier coatings of this invention are further illustrated by reference to the drawings as described hereafter. Referring to the drawings, FIG. 5 shows a side sectional view of an embodiment of the thermally barrier coating used with the metal substrate of an article indicated generally as 10. As shown in FIG. 5, article 10 has a metal substrate indicated generally as 14. Substrate 14 can comprise any of a variety of metals, or more typically metal alloys, that are typically protected by thermal barrier coatings, including those based on nickel, cobalt and/or iron alloys. For example, substrate 14 can comprise a high temperature, heat-resistant alloy, e.g., a superalloy. Such high temperature alloys are disclosed in various references, such as U.S. Pat. No. 5,399,313 (Ross et al), issued Mar. 21, 1995 and U.S. Pat. No. 4,116,723 (Gell et al), issued Sep. 26, 1978, both of which are incorporated by reference. High temperature alloys are also generally described in Kirk-Othmer's Encyclopedia of Chemical Technology, 3rd Ed., Vol. 12, pp. 417–479 (1980), and Vol. 15, pp. 787–800 (1981). Illustrative high temperature nickel-based alloys are designated by the trade names Inconel®, Nimonic®, René® (e.g., René® 80-, René® 95 alloys), and Udimet®. As described above, the type of substrate 14 can vary widely, but it is representatively in the form of a turbine part or component, such as an airfoil (e.g., blade) or turbine shroud.

As shown in FIG. 5, article 10 can also include a bond coat layer indicated generally as 18 that is adjacent to and overlies substrate 14. Bond coat layer 18 is typically formed from a metallic oxidation-resistant material that protects the underlying substrate 14 and enables the thermal barrier coating indicated generally as 22 to more tenaciously adhere to substrate 14. Suitable materials for bond coat layer 18 include MCrAlY alloy powders, where M represents a metal such as iron, nickel, platinum or cobalt, or NiAl(Zr) compositions, as well as various noble metal diffusion aluminides such as nickel aluminide and platinum aluminide, as well as simple aluminides (i.e., those formed without noble metals). This bond coat layer 18 can be applied, deposited or otherwise formed on substrate 10 by any of a variety of conventional techniques, such as physical vapor deposition (PVD), including electron beam physical vapor deposition (EB-PVD), plasma spray, including air plasma spray (APS) and vacuum plasma spray (VPS), or other thermal spray deposition methods such as high velocity oxy-fuel (HVOF) spray, detonation, or wire spray, chemical vapor deposition (CVD), pack cementation and vapor phase aluminiding in the case of metal diffusion aluminides (see, for example, U.S. Pat. No. 4,148,275 (Benden et al), issued Apr. 10, 1979; U.S. Pat. No. 5,928,725 (Howard et al), issued Jul. 27, 1999; and See U.S. Pat. No. 6,039,810 (Mantkowski et al), issued Mar. 21, 2000, all of which are incorporated by reference and which disclose various apparatus and methods for applying diffusion aluminide coatings, or combinations of such techniques, such as, for example, a combination of plasma spray and diffusion aluminide techniques. Typically, plasma spray or diffusion techniques are employed to deposit bond coat layer 18. Usually, the deposited bond coat layer 18 has a thickness in the range of from about 1 to about 20 mils (from about 25 to about 500 microns). For bond coat layers 18 deposited by PVD techniques such as EB-PVD or diffusion aluminide processes, the thickness is more typically in the range of from about 1 about 3 mils (from about 25 to about 76 microns). For bond coat layers deposited by plasma spray techniques such as APS, the thickness is more typically in the range of from about 3 to about 15 mils (from about 76 to about 381 microns).

As shown in FIG. 5, the thermal barrier coating (TBC) 22 is adjacent to and overlies bond coat layer 18. The thickness of TBC 22 is typically in the range of from about 1 to about 100 mils (from about 25 to about 2540 microns) and will depend upon a variety of factors, including the design parameters for article 10 that are involved. For example, for turbine shrouds, TBC 22 is typically thicker and is usually in the range of from about 30 to about 70 mils (from about 762 to about 1778 microns), more typically from about 40 to about 60 mils (from about 1016 to about 1524 microns). By contrast, in the case of turbine blades, TBC 22 is typically thinner and is usually in the range of from about 1 to about 30 mils (from about 25 to about 762 microns), more typically from about 3 to about 20 mils (from about 76 to about 508 microns).

The composition and thickness of the bond coat layer 18, and TBC 22 are typically adjusted to provide appropriate CTEs to minimize thermal stresses between the various layers and the substrate 14 so that the various layers are less prone to separate from substrate 14 or each other. In general, the CTEs of the respective layers typically increase in the direction of TBC 22 to bond coat layer 18, i.e., TBC 22 has the lowest CTE, while bond coat layer 18 has the highest CTE.

Referring to the FIG. 5, TBC 22 can be applied, deposited or otherwise formed on bond coat layer 18 by physical vapor deposition (PVD), and in particular electron beam physical vapor deposition (EB-PVD) techniques. The particular technique used for applying, depositing or otherwise forming TBC 22 will typically depend on the composition of TBC 22, its thickness and especially the physical structure desired for TBC 22. PVD techniques tend to be useful in forming TBCs having a strain-tolerant columnar structure. TBC 22 is typically formed from zirconia-containing ceramic compositions of this invention by EB-PVD techniques to provide a strain-tolerant columnar structure.

Various types of PVD and especially EB-PVD techniques well known to those skilled in the art can also be utilized to form TBCs 22 from the zirconia-containing ceramic composition. See, for example, U.S. Pat. No. 5,645,893 (Rickerby et al), issued Jul. 8, 1997 (especially col. 3, lines 36–63) and U.S. Pat. No. 5,716,720 (Murphy), issued Feb. 10, 1998) (especially col. 5, lines 24–61) and U.S. Pat. No. 6,447,854 (Rigney et al), issued Sep. 10, 2002, which are all incorporated by reference. Suitable EB-PVD techniques for use herein typically involve a coating chamber with a gas (or gas mixture) that preferably includes oxygen and an inert gas, though an oxygen-free coating atmosphere can also be employed. The zirconia-containing ceramic composition is then evaporated with electron beams focused on, for example, ingots of the ceramic composition so as to produce a vapor of metal ions, oxygen ions and one or more metal oxides. The metal and oxygen ions and metal oxides recombine to form TBC 22 on the surface of metal substrate 14, or more typically on bond coat layer 18. The porosity of TBC 22 can be controlled within the desired range previously described by adjusting the conditions under which the PVD/EB-PVD technique is carried out during deposition of the zirconia-containing ceramic composition on the bond coat layer 18, in particular the pressure and/or temperature conditions (e.g., by reducing the pressure).

While specific embodiments of the method of the present invention have been described, it will be apparent to those skilled in the art that various modifications thereto can be made without departing from the spirit and scope of the present invention as defined in the appended claims.

What is claimed is:

1. A thermal barrier coating for an underlying metal substrate which comprises a zirconia-containing ceramic composition having a c/a ratio of the zirconia lattice in the range of from about 1.0057 to about 1.0110 and stabilized in the tetragonal phase by a stabilizing amount of a stabilizing metal oxide, the thermal barrier coating having:
   1. a fraction of porosity of from about 0.15 to about 0.25; and
   2. an impact and erosion resistance property defined by at least one of the following formulas:

$$I=\exp.[5.85-(144\times s)-(3.68\times p)]; \quad (a)$$
   $$E=[187-(261\times p)-(9989\times s)]; \quad (b)$$

wherein $s=1.0117-c/a$ ratio; p is the fraction of porosity; I is at least about 70 g/mil; and E is at least about 80 g/mil.

2. The coating of claim 1 which has a strain-tolerant columnar structure.

3. The coating of claim 2 wherein the c/a ratio is in the range of from about 1.0069 to about 1.0096.

4. The coating of claim 2 wherein the fraction of porosity is from about 0.18 to about 0.20.

5. The coating of claim 2 which has an impact and erosion resistance property defined by both of formulas (a) and (b).

6. The coating of claim 5 wherein I is at least about 90 g/mil and E is at least about 100 g/mil.

7. The coating of claim 2 wherein the stabilizing metal oxide is selected from the group consisting of yttria, calcia, ceria, scandia, magnesia, india, lanthana, gadolinia, neodymia, samaria, dysprosia, erbia, ytterbia, europia, praseodymia, and mixtures thereof.

8. The coating of claim 7 wherein the stabilizing metal oxide is selected from the group consisting of yttria, lanthana, and mixtures thereof.

9. The coating of claim 8 wherein the stabilizing metal oxide is yttria.

10. A thermally protected article, which comprises:
   A. a metal substrate; and
   B. a thermal barrier coating which comprises a zirconia-containing ceramic composition having a c/a ratio of the zirconia lattice in the range of from about 1.0057 to about 1.0110 and stabilized in the tetragonal phase by a stabilizing amount of a stabilizing metal oxide, the thermal barrier coating having:
      1. a fraction of porosity of from about 0.15 to about 0.25; and
      2. an impact and erosion resistance property defined by at least one of the following formulas:

$$I=\exp.[5.85-(144\times s)-(3.68\times p)]; \quad (a)$$
      $$E=[187-(261\times p)-(9989\times s)]; \quad (b)$$

wherein $s=1.0117-c/a$ ratio; p is the fraction of porosity; I is least about 70 g/mil; and E is least about 80 g/mil.

11. The article of claim 10 which further comprises a bond coat layer adjacent to and overlaying the metal substrate and wherein the inner layer is adjacent to and overlies the bond coat layer.

12. The article of claim 11 wherein the thermal barrier coating has a thickness of from about 1 to about 100 mils.

13. The article of claim 12 wherein the thermal barrier coating has a strain-tolerant columnar structure.

14. The article of claim 13 wherein the c/a ratio is in the range of from about 1.0069 to about 1.0096.

15. The article of claim 13 wherein the fraction of porosity is from about 0.18 to about 0.20.

16. The article of claim 13 wherein the thermal barrier coating has an impact and erosion resistance property defined by both of formulas (a) and (b).

17. The article of claim 16 wherein I is at least about 90 g/mil and E is at least about 100 g/mil.

18. The article of claim 13 wherein the stabilizing metal oxide is selected from the group consisting of yttria, calcia, ceria, scandia, magnesia, india, lanthana, gadolinia, neodymia, samaria, dysprosia, erbia, ytterbia, europia, praseodymia, and mixtures thereof.

19. The article of claim 18 wherein the stabilizing metal oxide is selected from the group consisting of yttria, lanthana, and mixtures thereof.

20. The coating of claim 19 wherein the stabilizing metal oxide is yttria.

21. The article of claim 13 which is a turbine engine component.

22. The article of claim 21 which is a turbine shroud and wherein the thermal barrier coating has a thickness of from about 30 to about 70 mils.

23. The article of claim 21 which is a turbine airfoil and wherein the thermal barrier coating has a thickness of from about 3 to about 20 mils.

24. A method for preparing a thermal barrier coating for an underlying metal substrate, the method comprising the step of:
   a. depositing over the metal substrate a zirconia-containing ceramic composition having a c/a ratio of the zirconia lattice in the range of from about 1.0057 to about 1.0110 and stabilized in the tetragonal phase by a stabilizing amount of a stabilizing metal oxide selected from the group consisting of yttria, calcia, ceria, scandia, magnesia, india, lanthana, gadolinia, neodymia, samaria, dysprosia, erbia, ytterbia, europia, praseodymia, and mixtures thereof to form a thermal barrier coating having:
      1. a fraction of porosity of from about 0.15 to about 0.25; and
      2. an impact and erosion resistance property defined by at least one of the following formulas:

$$I=\exp.[5.85-(144\times s)-(3.68\times p)]; \quad (a)$$
      $$E=[187-(261\times p)-(9989\times s)]; \quad (b)$$

wherein $s=1.0117-c/a$ ratio; p is the fraction of porosity; I is least about 70 g/mil; and E is least about 80 g/mil.

25. The method of claim 24 wherein a bond coat layer is adjacent to and overlies the metal substrate and wherein the thermal barrier coating is formed on the bond coat layer.

26. The method of claim 25 wherein the zirconia-containing ceramic composition is deposited by physical vapor deposition to form a thermal barrier coating having a strain-tolerant columnar structure.

27. The method of claim 26 wherein the thermal barrier coating is formed so as to have an impact and erosion resistance property defined by both of formulas (a) and (b).

28. The method of claim 27 wherein the thermal barrier coating is formed to have an impact and erosion resistance property defined by formulas (a) and (b) such that I is at least about 90 g/mil and E is at least about 100 g/mil.

29. The method of claim 26 wherein the thermal barrier coating is formed from a zirconia-containing ceramic composition stabilized with a stabilizing metal oxide selected from the group consisting of yttria, lanthana, and mixtures thereof.

30. The method of claim 27 wherein the thermal barrier coating is formed to have a fraction of porosity of from about 0.18 to about 0.20 and is formed from a zirconia-containing ceramic composition stabilized with yttria and having a c/a ratio in the range of from about 1.0069 to about 1.0096.

* * * * *